(12) United States Patent
Yamashita et al.

(10) Patent No.: US 10,804,026 B2
(45) Date of Patent: Oct. 13, 2020

(54) INDUCTOR ELEMENT AND METHOD OF MANUFACTURING THE SAME

(71) Applicant: TDK CORPORATION, Tokyo (JP)

(72) Inventors: Yasuhide Yamashita, Tokyo (JP); Katsushi Yasuhara, Tokyo (JP); Chiomi Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 209 days.

(21) Appl. No.: 15/848,567

(22) Filed: Dec. 20, 2017

(65) Prior Publication Data

US 2018/0204661 A1    Jul. 19, 2018

(30) Foreign Application Priority Data

Jan. 16, 2017   (JP) ................ 2017-005463

(51) Int. Cl.

| | | |
|---|---|---|
| *H01F 27/02* | (2006.01) | |
| *H01F 27/255* | (2006.01) | |
| *H01F 41/04* | (2006.01) | |
| *H01F 3/08* | (2006.01) | |
| *H01F 17/04* | (2006.01) | |
| *B29C 43/14* | (2006.01) | |
| *H01F 41/02* | (2006.01) | |
| *B29C 43/18* | (2006.01) | |
| *H01F 1/36* | (2006.01) | |
| *H01F 3/14* | (2006.01) | |
| *B29K 101/10* | (2006.01) | |
| *B29K 705/00* | (2006.01) | |
| *B29K 505/00* | (2006.01) | |

(52) U.S. Cl.
CPC .......... *H01F 27/255* (2013.01); *B29C 43/14* (2013.01); *H01F 3/08* (2013.01); *H01F 17/043* (2013.01); *H01F 27/02* (2013.01); *H01F 41/0246* (2013.01); *H01F 41/04* (2013.01); *B29C 43/18* (2013.01); *B29C 2043/182* (2013.01); *B29K 2101/10* (2013.01); *B29K 2505/00* (2013.01); *B29K 2705/00* (2013.01); *B29K 2995/0008* (2013.01); *H01F 1/36* (2013.01); *H01F 3/14* (2013.01); *H01F 2017/046* (2013.01); *H01F 2017/048* (2013.01)

(58) Field of Classification Search
CPC .................................................. H01F 27/00–40
USPC ............. 336/65, 83, 212, 220–223, 232–234
See application file for complete search history.

(56) References Cited

U.S. PATENT DOCUMENTS

| | | | |
|---|---|---|---|
| 9,478,346 B2 * | 10/2016 | Nakata | .................... H01F 27/06 |
| 2009/0231077 A1 | 9/2009 | Liao et al. | |
| 2012/0146759 A1 | 6/2012 | Shibuya et al. | |

FOREIGN PATENT DOCUMENTS

| | | |
|---|---|---|
| CN | 102349120 A | 2/2012 |
| JP | 2002-252120 A | 9/2002 |

(Continued)

*Primary Examiner* — Tuyen T Nguyen
(74) *Attorney, Agent, or Firm* — Oliff PLC

(57) ABSTRACT

A method of manufacturing an inductor element includes preparing an insert member including a winding portion where a conductor is wound in a coil shape. A plurality of preliminary green compacts is obtained by conducting a preliminary compression molding of a granule containing a magnetic powder and a resin at a pressure of $2.5 \times 10^2$ to $1 \times 10^3$ MPa. The insert member and the plurality of preliminary green compacts are integrated so that a joint interface of the plurality of preliminary green compacts is formed intermittently.

1 Claim, 16 Drawing Sheets

(56) References Cited

FOREIGN PATENT DOCUMENTS

JP       2002252120 A  *  9/2002
JP       2009-224745 A     10/2009

* cited by examiner

FIG. 1
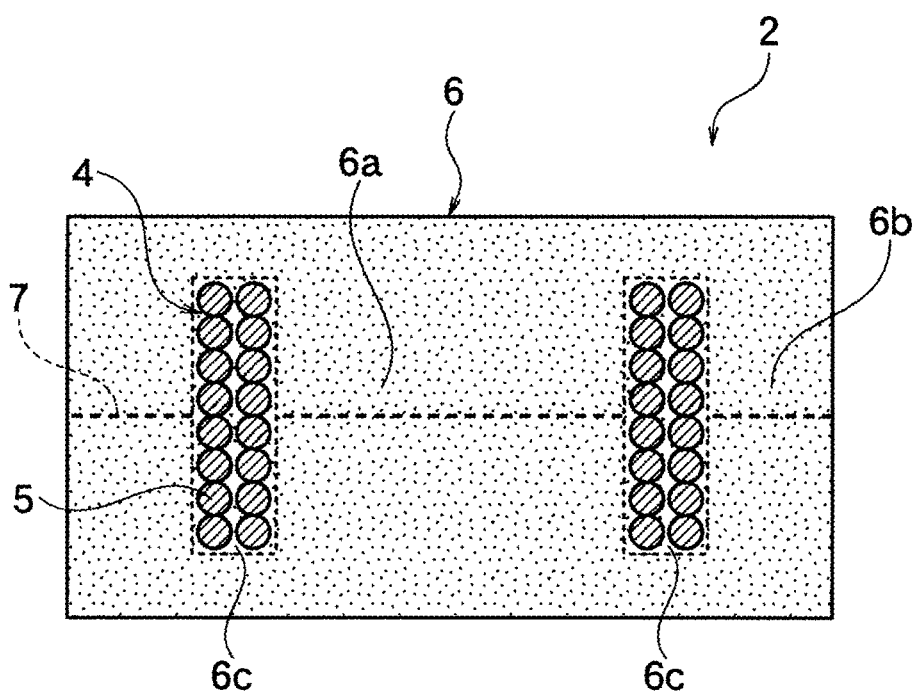
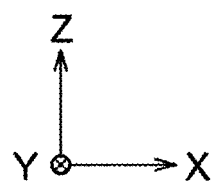

FIG. 12
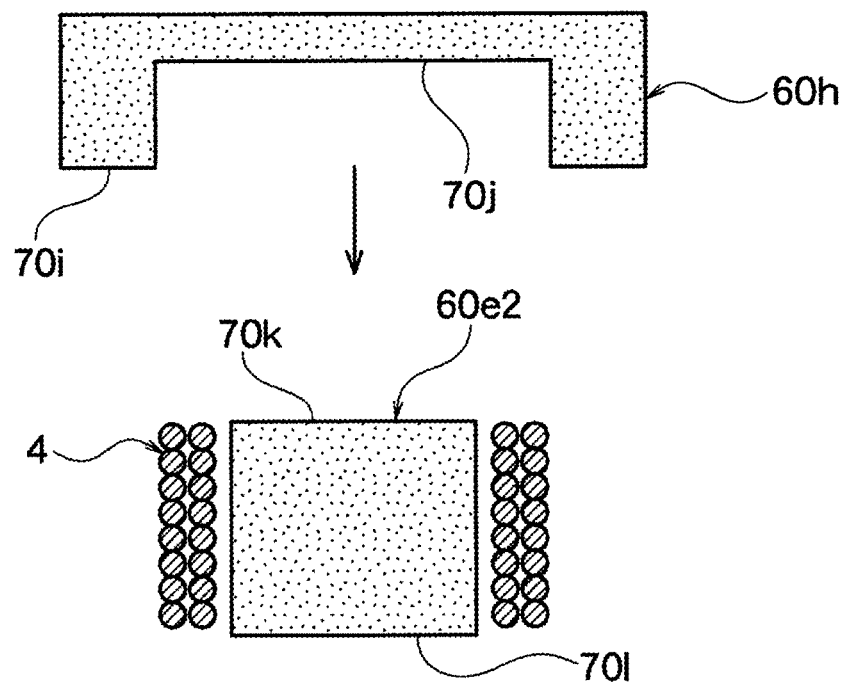
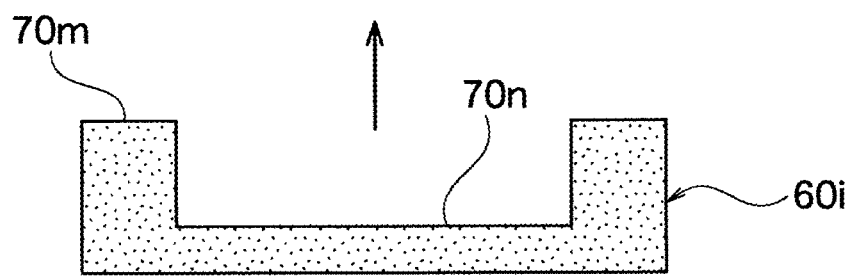
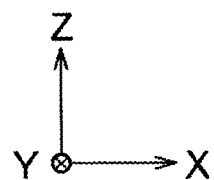

INDUCTOR ELEMENT AND METHOD OF MANUFACTURING THE SAME

BACKGROUND OF THE INVENTION

1. Field of the Invention

The present invention relates to an inductor element and a method of manufacturing the same.

2. Description of the Related Art

As an example of inductor elements, an inductor element where a coil is embedded in a core obtained by adding a resin to a metal magnetic powder and molding it with pressure is known.

Patent Document 1 below discloses a method of manufacturing a coil device where a magnetic powder and a thermosetting resin are mixed and molded with pressure so as to form two pressed powders, and the pressed powders are re-pressed while sandwiching a coil portion and are thermosetted. When the pressed powders are molded with the re-pressing, there are provided with a large-hardness part where the shape of the pressed powders does not collapse and a small-hardness part where the shape of the pressed powders collapses, and the pressed powders are molded while the small-hardness part is being collapsed by the re-pressing.

In the technique of Patent Document 1, however, the molding needs to be carried out by collapsing a part of the pressed powders and re-pressing it. In recent years, as the current of coil devices has been increased, DC superposition characteristics of coils need to be improved. To improve DC superposition characteristics, density needs to be increased.

In addition, since the shape of the small-hardness part collapses easily during the molding with re-pressing, a sufficient pressure transmission cannot be achieved, and the density of a part where the pressed powders are joined decreases particularly. That is, the density of the core easily becomes uneven in an inductor element obtained finally. Furthermore, if a pressure during the re-pressing is high for increasing the density, a coil film is broken or an inner wall of a die and the surface of the magnetic powder are rubbed, and withstand voltage decreases easily.

Patent Document 1: JP 2002-252120 A

SUMMARY OF THE INVENTION

The present invention has been achieved under such circumstances. It is an object of the invention to provide a method of manufacturing an inductor element excelling in withstand voltage, inductance, and DC superposition characteristics.

To achieve the above object, a method of manufacturing an inductor element according to the present invention comprises the steps of:

preparing an insert member including a winding portion where a conductor is wound in a coil shape;

obtaining a plurality of preliminary green compacts by conducting a preliminary compression molding of a granule containing a magnetic powder and a resin at a pressure of $2.5 \times 10^2$ to $1 \times 10^3$ MPa; and integrating the insert member and the plurality of preliminary green compacts so that a joint interface of the plurality of preliminary green compacts is formed intermittently.

An inductor element manufactured by the above-mentioned method is excellent in all of withstand, inductance, and DC superposition characteristics.

The step of integrating the insert member and the plurality of preliminary green compacts may be conducted by a main compression.

The magnetic powder and the resin may be inserted into a space between the conductor of the winding portion and the preliminary green compacts in the step of integrating the insert member and the plurality of preliminary green compacts.

A pressure during the main compression may be equal to or less than the pressure during the preliminary compression molding.

An inductor element according to the present invention comprises:

a winding portion where a conductor is wound in a coil shape; and a core portion surrounding the winding portion and containing a magnetic powder and a resin, wherein a joint interface is formed intermittently in the core portion, and in the joint interface, a region where three or more pairs of magnetic particles are not continuously in contact with each other is observed linearly on a cross section of the inductor element by a low-accelerating voltage scanning electron microscope.

BRIEF DESCRIPTION OF THE DRAWINGS

FIG. 1 is a cross-sectional view of an inductor element manufactured by a method according to an embodiment of the present invention.

FIG. 12 is a cross-sectional view along XII-XII line of FIG. 11.

DETAILED DESCRIPTION OF THE PREFERRED EMBODIMENT

Figure 2:
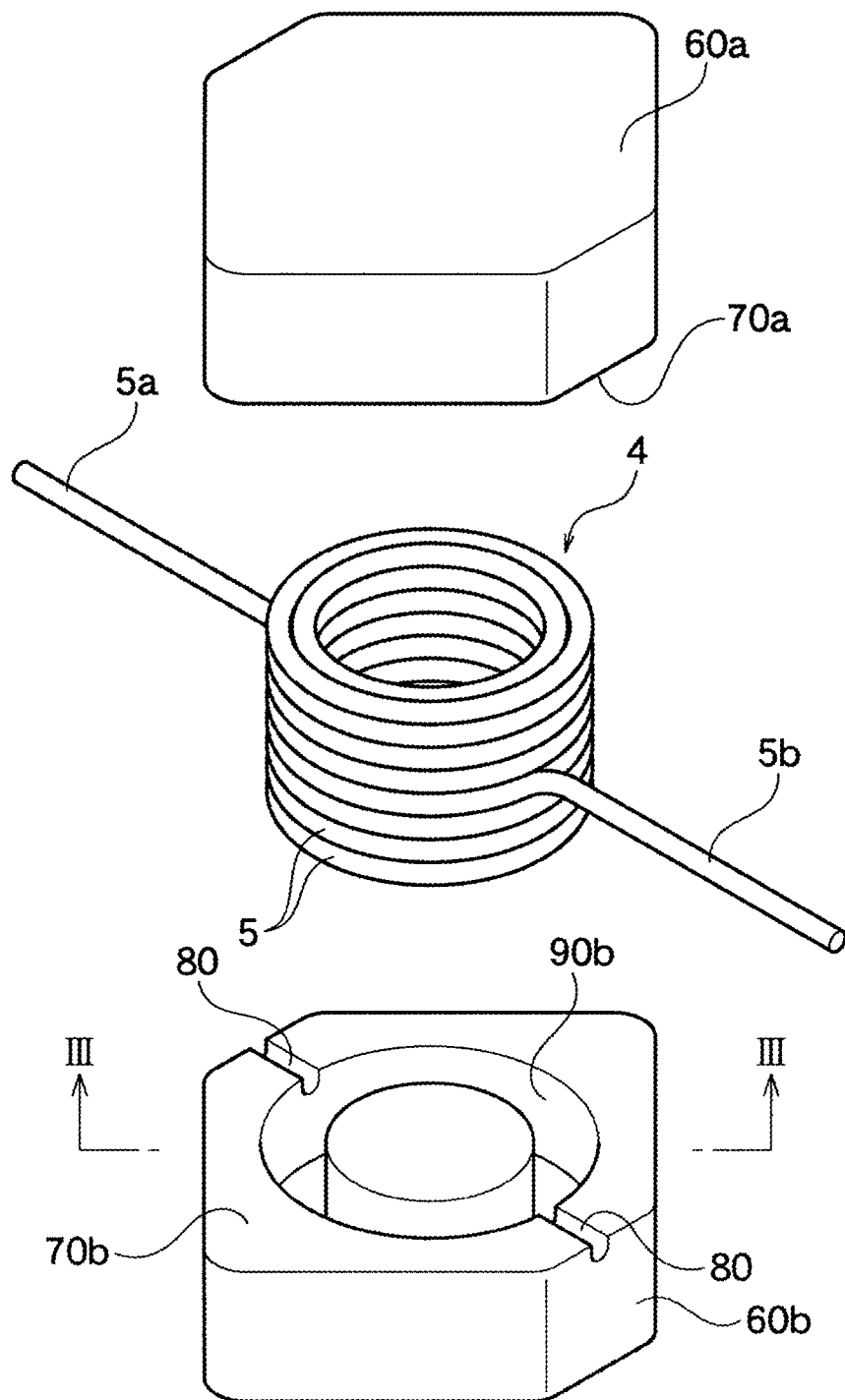
FIG. 2 is a perspective view showing preliminary green compacts and an insert member used in a manufacturing process of the inductor element shown in FIG. 1.

Hereinafter, the present invention is described based on embodiments shown in figures, but is not limited to the embodiments below.

First Embodiment

As shown in FIG. 1, an inductor element 2 manufactured by a method according to an embodiment of the present invention includes a winding portion 4 and a core portion 6. In the winding portion 4, a conductor 5 is wound in a coil shape. The core portion 6 includes an inner circumferential portion (also referred to as an inner core portion) 6a positioned on an inner circumference side of the winding portion 4 and an outer circumferential portion 6b positioned on an outer circumference side of the winding portion 4. A magnetic powder and a resin constituting the core portion 6 are inserted into a space 6c between the conductor 5 constituting the winding portion 4 and the core portion 6.

In the inductor element 2 of the present embodiment, a top surface and a bottom surface of the core portion 6 are approximately perpendicular to the Z-axis, and a side surface of the core portion 6 is approximately perpendicular to a plane surface including the X-axis and the Y-axis. The winding portion 4 has a winding axis that is approximately parallel to the Z-axis. The shape of the core portion 6 is, however, not limited to the shape of FIG. 1, and may be cylinder, ellipse, or the like.

The inductor element 2 of the present embodiment has any size, such as a size where its portion excluding lead portions 5a and 5b is contained in a cuboid or cube of (2 to 17) mm×(2 to 17) mm×(1 to 7) mm. Incidentally, FIG. 1 does not illustrate the lead portions 5a and 5b of the winding portion 4 shown in FIG. 2. The lead portions 5a and 5b formed on both ends of the conductor 4 constituting the winding portion 4 are configured to be led toward the outside of the core portion 6 shown in FIG. 1.

An outer circumference of the conductor (wire) 5 constituting the winding portion 4 is covered with an insulating cover layer as necessary. The conductor 5 is composed of, for example, Cu, Al, Fe, Ag, Au, or an alloy containing these metals. The insulating cover layer is composed of polyurethane, polyamide imide, polyimide, polyester, polyesterimide, polyester-nylon, or the like. The conductor 5 has a cross section of circular shape, flat shape, or the like. In the present embodiment, the conductor 5 has a cross section of circular shape.

The core portion 6 has a magnetic powder and a resin (binder). The magnetic powder is composed of any material, such as a ferrite of Mn—Zn, Ni—Cu—Zn, etc. and a metal of Fe—Si (iron-silicon), sendust (Fe—Si—Al; iron-silicon-aluminum), Fe—Si—Cr (iron-silicon-chromium), permalloy (Fe—Ni), etc. The magnetic powder has any crystal structure, such as amorphous and crystalline. The resin is any kind, such as epoxy resin, phenol resin, polyimide, polyamide imide, silicone resin, a material where these are mixed.

Figure 14:
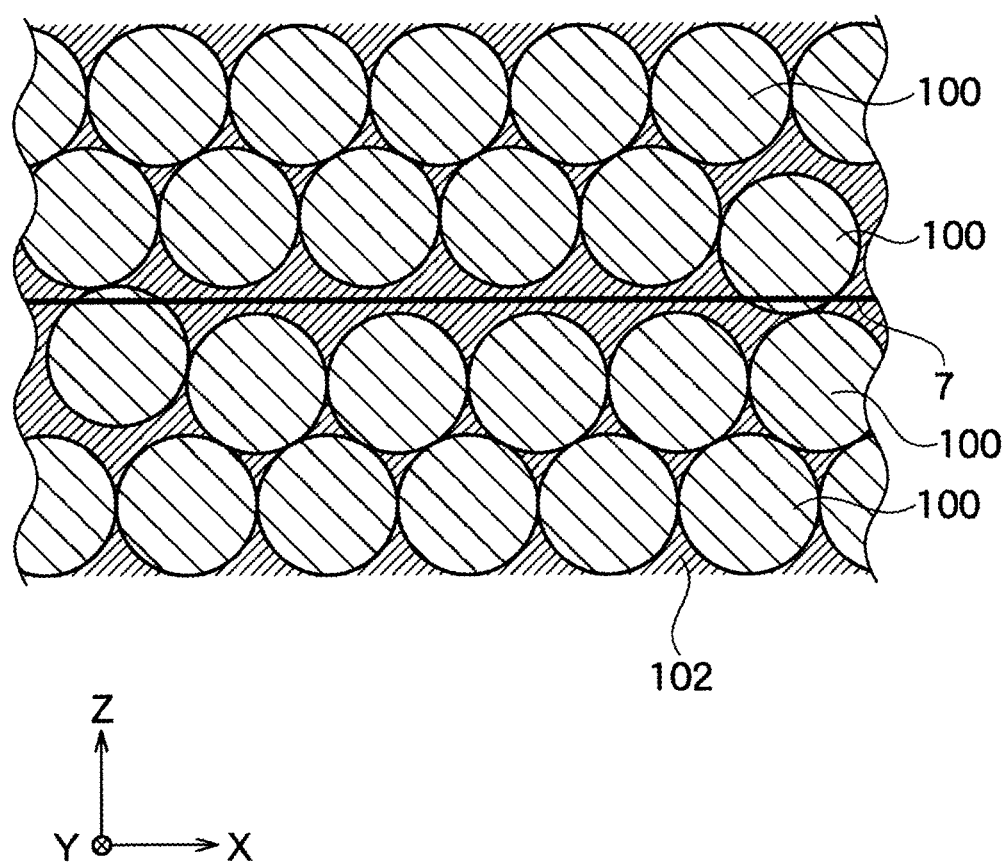
FIG. 14 is a schematic view for explanation of definition of joint interface.
Figure 15:
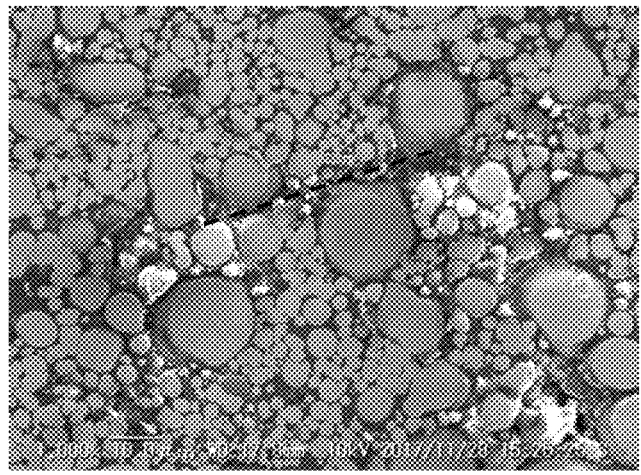
FIG. 15 is a SEM image showing a joint interface.
Figure 16:
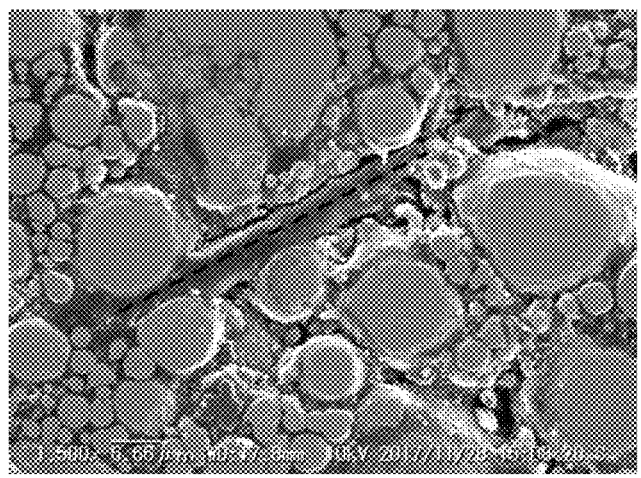
FIG. 16 is a SEM image showing a joint interface.
Figure 17:
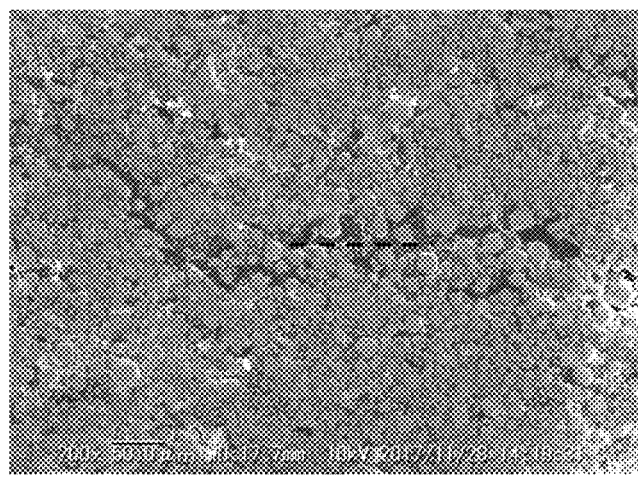
FIG. 17 is a SEM image showing a joint interface.
Figure 18:
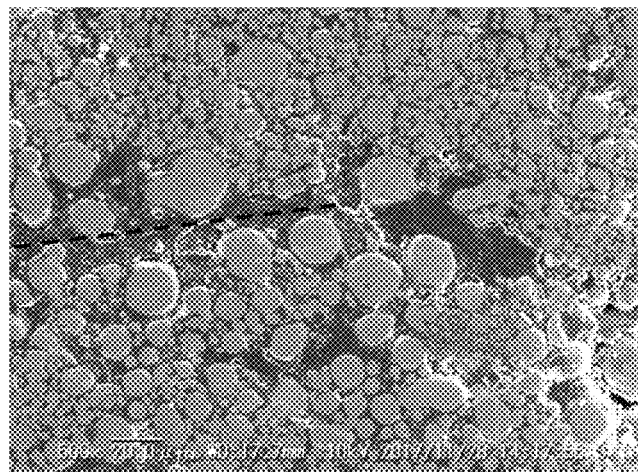
FIG. 18 is a SEM image showing a joint interface.

In the present embodiment, a joint interface 7 is formed intermittently inside the core portion 6. As shown in FIG. 14, a region where three or more pairs of magnetic particles 100 are not continuously in contact with each other is observed linearly in a cross-sectional picture of the inductor element of FIG. 1 along the Z-axis. The line observed is defined as the joint interface 7.

In FIG. 14, the joint interface 7 is formed vertically to the Z-axis. The joint interface 7 is often formed vertically to the Z-axis, but the joint interface 7 may not be vertical to the Z-axis. As shown in FIG. 14, a resin 102 exists among a plurality of magnetic particles 100. Incidentally, an intermittent formation of the joint interface 7 can be confirmed by a low-accelerating voltage scanning electron microscope with respect to a cross section of the inductor element. SEM images actually showing joint interfaces are described in FIG. 15 to FIG. 18. A dotted line in each figure is the joint interface 7.

Figure 3:
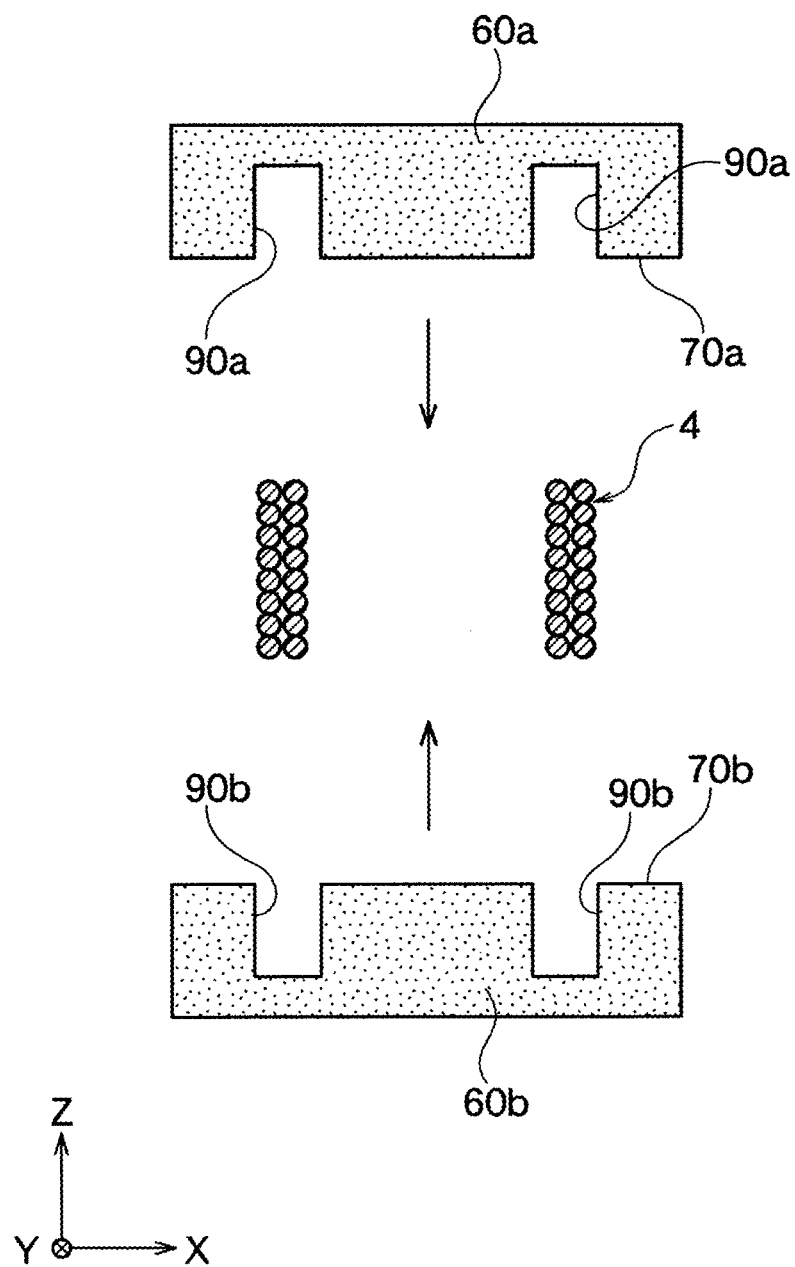
FIG. 3 is a cross-sectional view along III-III line shown in FIG. 2.

Next, a method of manufacturing the inductor element 2 shown in FIG. 1 is described using FIG. 2 and FIG. 3.

In a method of manufacturing the inductor element according to an embodiment of the present invention, the inductor element 2 is manufactured by integrating two preliminary green compacts 60a and 60b and an insert member having the winding portion 4 constituted by an air-core coil or so. Both ends of the conductor 5 constituting the winding portion 4 are led to the outside of the winding portion 4. Terminals (not illustrated) may be connected to the lead portions 5a and 5b after a main compression or before a main compression in advance.

Joint projected surfaces 70a and 70b are respectively formed on the preliminary green compacts 60a and 60b and are abutted and joined with each other, whereby an intermittent joint interface 7 shown in FIG. 1 is obtained. The joint projected surfaces 70a and 70b are respectively provided with housing concave portions 90a and 90b for housing an upper half and a lower half of the winding portion 4. The housing concave portions 90a and 90b have a size where inner and outer circumferences and ends in the winding axis direction of the winding portion 4 as an insert member can contact with and enter into the housing concave portions 90a and 90b.

Either or both of the joint projected surfaces 70a and 70b is/are provided with a leading groove 80 for leading the lead portions 5a and 5b to the outside of the core portion 6. Incidentally, FIG. 2 illustrates a pair of lead portions 5a and 5b, but FIG. 3 fails to illustrate the pair of lead portions 5a and 5b.

First, granules to be a raw material of the preliminary green compacts 60a and 60b are prepared by any method. For example, the granules can be prepared by adding a resin to a magnetic powder and stirring and drying it.

The magnetic powder has any particle size, such as an average particle size of 0.5 to 50 μm. Examples of the resin include epoxy resin, phenol resin, polyimide, polyamide imide, silicone resin, and a material where these are combined. An insulating film may be formed on the surface of the magnetic powder before mixing the magnetic powder and the resin. For example, an insulating film of $SiO_2$ film can be formed by sol-gel method.

Coarse granules may be removed by adding the resin to the magnetic powder, stirring it, and passing it through a mesh. The resin may be diluted by a solvent when added to the magnetic powder. The solvent is ketones, for example.

The amount of the resin is not limited, but is preferably 1.0 to 6.0 wt % with respect to 100 wt % of the magnetic powder. When the amount of the resin is appropriate, the joint projected surfaces 70a and 70b are easily joined during a main compression mentioned below.

The granules containing the magnetic powder and the resin are filled in a die cavity and are preliminarily compressed so as to manufacture and the preliminary green compacts 60a and 60b. The preliminary compression is carried out at a pressure of $2.5\times10^2$ to $1\times10^3$ MPa (2.5 to 10 t/cm$^2$). The preliminary green compacts 60a and 60b have any density, such as 4.0 to 6.5 g/cm$^3$. When the preliminary compression is carried out at a pressure of $2.5\times10^2$ to $1\times10^3$ MPa, it is possible to prevent a positional distortion of the winding portion 4 and/or a shape distortion of the wire generated after a main compression mentioned below, and it is possible to manufacture an inductor element excelling in all of withstand voltage, inductance, and DC superposition characteristics.

Next, the obtained preliminary green compacts 60a and 60b and insert member are arranged in another die cavity that is different from the die cavity in the manufacture of the preliminary green compacts in such a manner of FIG. 2 and FIG. 3, and a main compression (crimping) is carried out, whereby an inductor element 2 is obtained. The main compression is carried out at any pressure, such as a pressure of $1\times10^2$ to $8\times10^2$ MPa (1 to 8 t/cm$^2$). The pressure during the main compression is lower than the pressure during the preliminary compression (100%) by preferably about 40 to 80%, more preferably about 50 to 60%. When the pressure during the main compression is low, a positional distortion of the winding portion 4 and/or a shape distortion of the wire generated after the main compression is/are prevented, and withstand voltage characteristics tend to improve better as the pressure during the preliminary compression is larger than the pressure during the main compression.

The resin is preferably completely hardened by heating the inductor element 2 taken out from the die after the main compression. Specifically, the resin is preferably completely hardened by heating the inductor element 2, which has been taken out from the die, at a temperature that is higher than a temperature where the resin begins to be hardened.

In the inductor element 2 manufactured by the above-mentioned method, the preliminary green compacts 60a and 60b remain as they are except for the joint interface 7, and it is thereby possible to prevent a positional distortion of the winding portion 4 and/or a shape distortion of the wire and form the core portion 6 densely. Thus, withstand voltage can be also improved while inductance and DC superposition characteristics are improved. When the main compression is carried out at a pressure that is lower than a pressure during the preliminary compression, the joint projected surfaces 70a and 70b and their surroundings partially flow and are mixed together, and the joint interface 7 is formed.

In the present embodiment, the core portion 6 of the inductor element 2 finally obtained can be manufactured uniformly and densely. As a result, inductance and DC superposition characteristics can be improved more than those of conventional inductor elements.

Second Embodiment

Hereinafter, Second Embodiment is described using FIG. 4 to FIG. 6, but is not described with respect to common matters with First Embodiment (common components, effects, etc./the same shall apply hereinafter).

Figure 4:
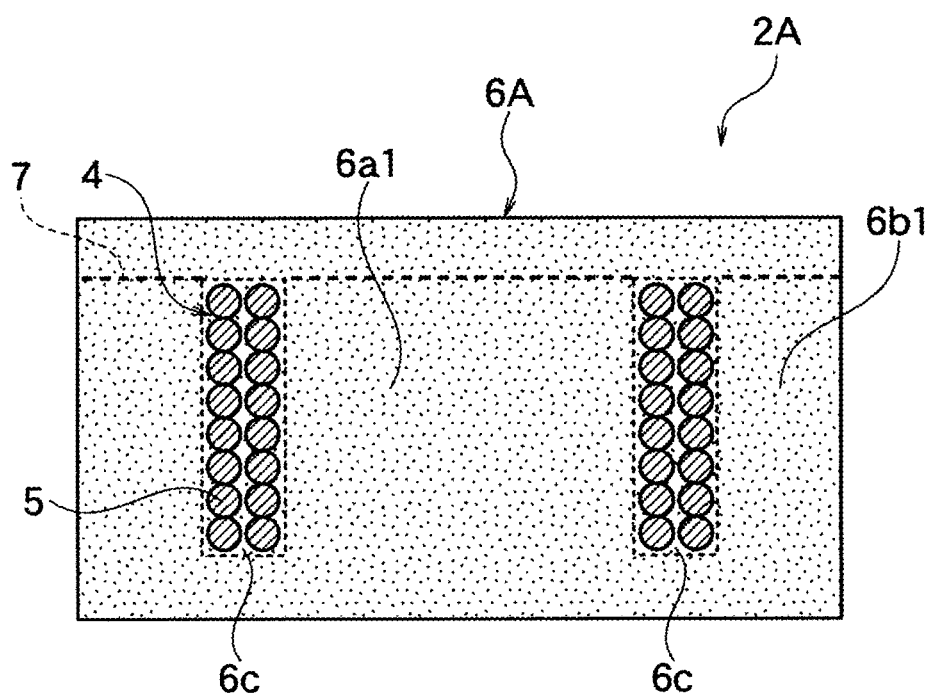
FIG. 4 is a cross-sectional view of an inductor element manufactured by a method of another embodiment of the present invention.

As shown in FIG. 4, an inductor element 2A of Second Embodiment is different from the inductor element 2 of First Embodiment in position of the joint interface 7.

Figure 5:
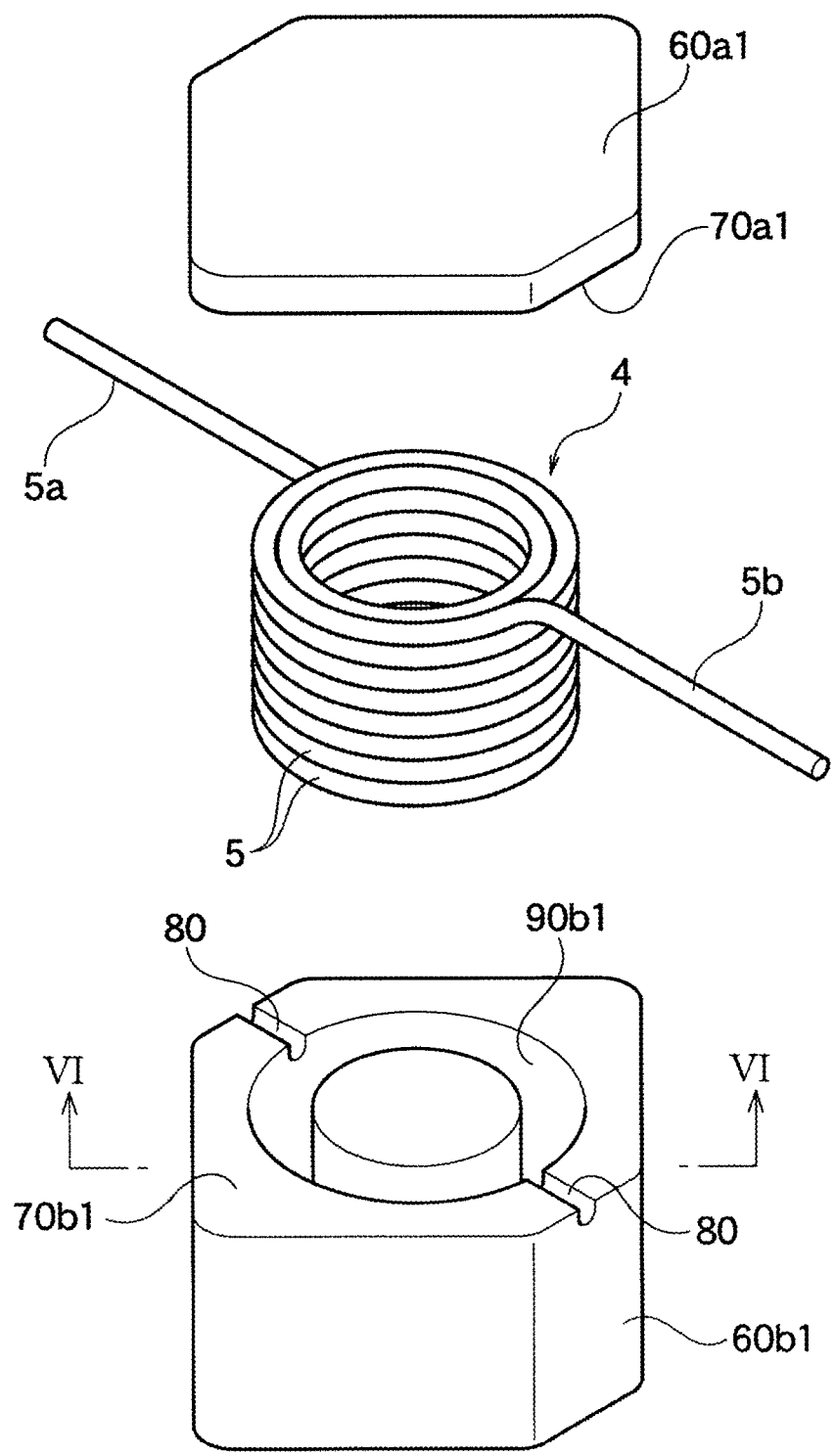
FIG. 5 is a perspective view showing preliminary green compacts and an insert member used in a manufacturing process of the inductor element shown in FIG. 4.
Figure 6:
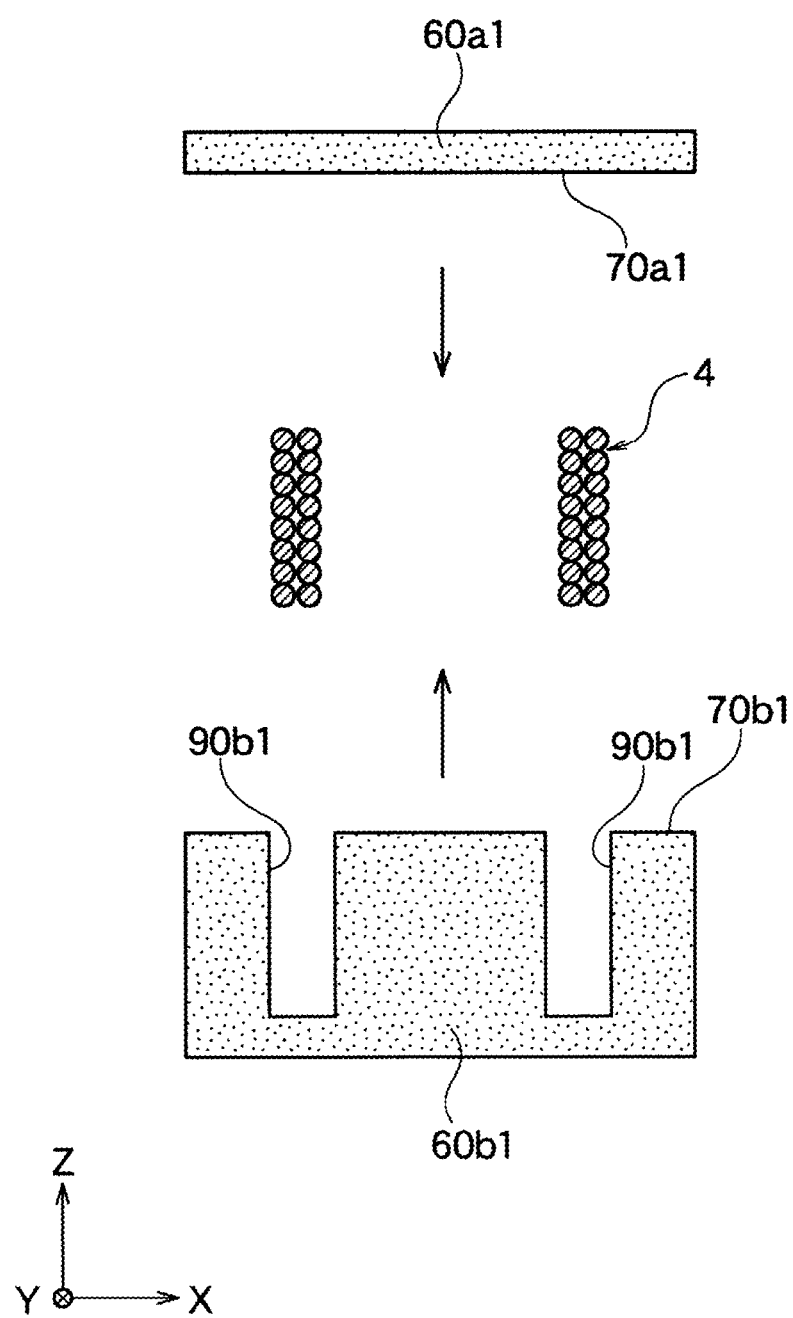
FIG. 6 is a cross-sectional view along VI-VI line of FIG. 5.

As shown in FIG. 5 and FIG. 6, examples of methods of manufacturing the inductor element 2A of Second Embodiment include a method of preparing a preliminary green compact 60a1 with a plate shape and a preliminary green compact 60b1 with a pot shape. A joint projected surface 70a1 of the preliminary green compact 60a1 with a plate shape and a joint projected surface 70b1 of the preliminary green compact 60b1 with a pot shape are joined, and the joint interface 7 shown in FIG. 4 is formed intermittently. In accordance with positional change of the joint interface 7, positions of lead portions 5a and 5b shown in FIG. 5 are changed.

Third Embodiment

Hereinafter, Third Embodiment is described using FIG. 7 to FIG. 9, but is not described with respect to common matters with First and Second Embodiments (common components, effects, etc./the same shall apply hereinafter).

Figure 7:
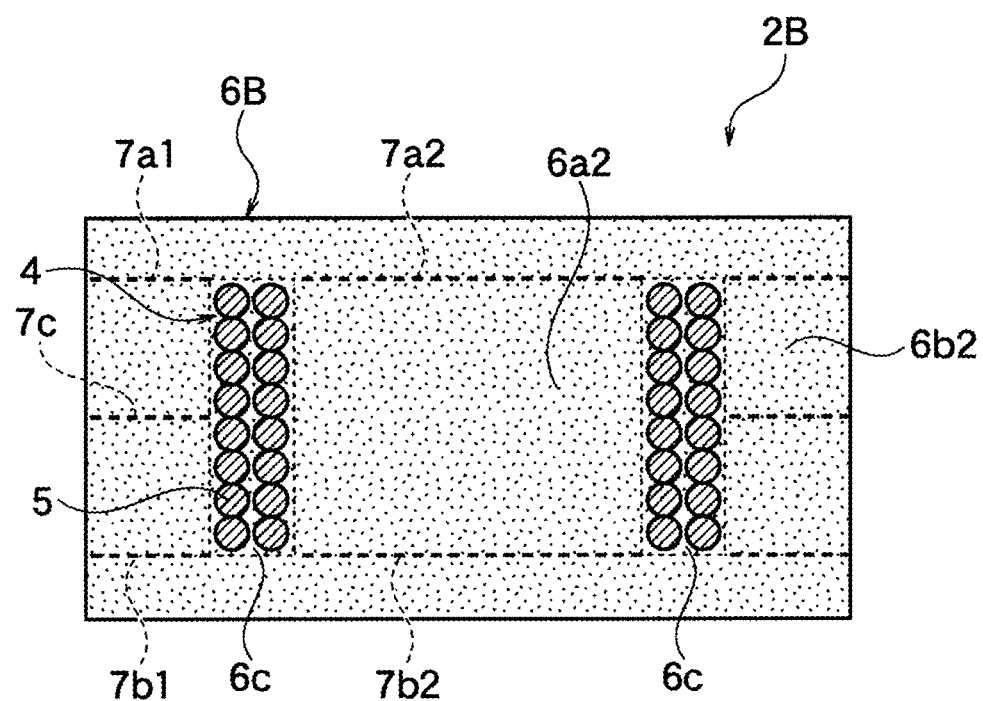
FIG. 7 is a cross-sectional view of an inductor element manufactured by a method of manufacturing an inductor element according to another embodiment of the present invention.

In an inductor element 2B obtained by a method of manufacturing an inductor element of Third Embodiment, as shown in FIG. 7, there exist joint interfaces 7a1, 7a2, 7b1, 7b2, and 7c more than First Embodiment. Specifically, the joint interfaces 7a2 and 7b2 are formed intermittently between a central core portion 6a2 and an outer circumferential portion 6b2, and the joint interfaces 7a1, 7b1, and 7c are also formed intermittently at predetermined intervals in the Z-axis direction inside the outer circumferential portion 6b2. The larger the number of joint interfaces is, the better DC superposition characteristics tend to improve.

Figure 8:
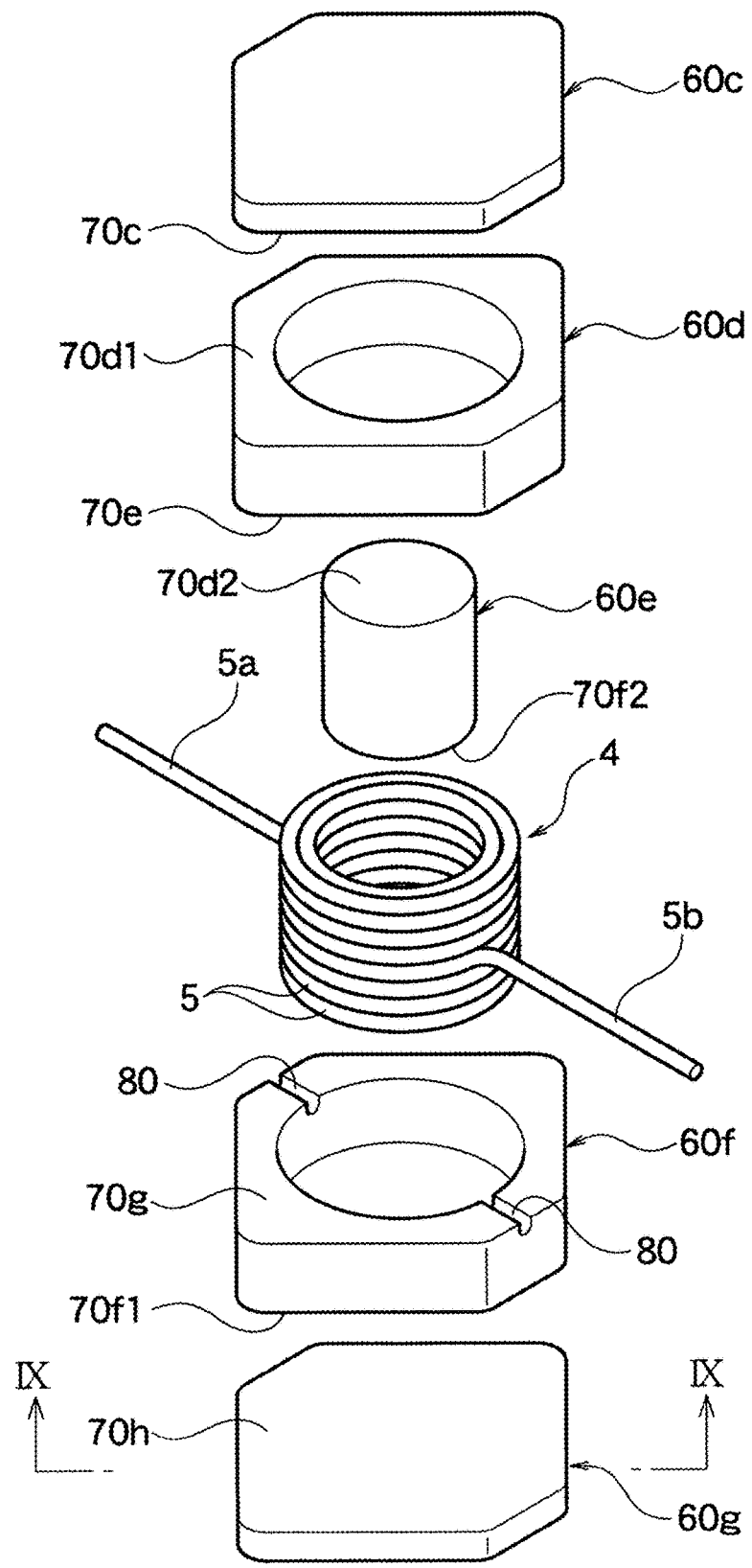
FIG. 8 is a perspective view showing preliminary green compacts and an insert member used in a manufacturing process of the inductor element shown in FIG. 7.
Figure 9:
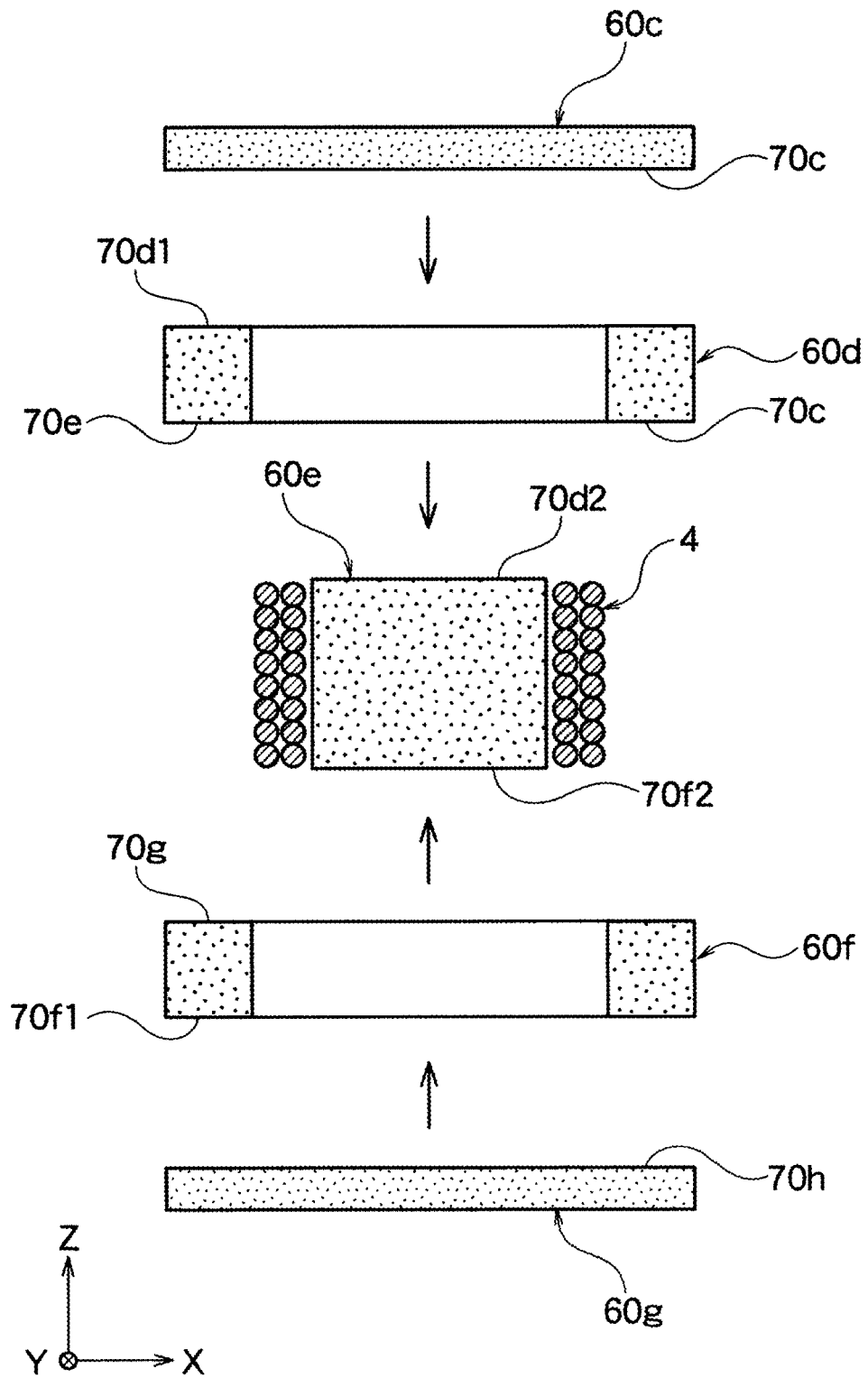
FIG. 9 is a cross-sectional view along IX-IX line of FIG. 8.

As shown in FIG. 8 and FIG. 9, examples of methods of manufacturing the inductor element 2B of Third Embodiment include a method of preparing five preliminary green compacts 60c, 60d, 60e, 60f, and 60g. A joint projected surface 70c of the preliminary green compact 60c with a plate shape and a joint projected surface 70d1 of the preliminary green compact 60d with a ring shape are joined, and the joint interface 7a1 shown in FIG. 7 is formed intermittently.

The joint projected surface 70c of the preliminary green compact 60c and a joint projected surface 70d2 of the preliminary green compact 60e with a column shape shown in FIG. 8 are joined, and the joint interface 7a2 shown in FIG. 7 is formed intermittently. A joint projected surface 70c of the preliminary green compact 60d with a ring shape and a joint projected surface 70g of the preliminary green compact 60f with a ring shape shown in FIG. 8 are joined, and the joint interface 7c shown in FIG. 7 is formed intermittently.

A joint projected surface 70f1 of the preliminary green compact 60f with a ring shape and a joint projected surface 70h of the preliminary green compact 60g with a plate shape shown in FIG. 8 are joined, and the joint interface 7b1 shown in FIG. 7 is formed intermittently. A joint projected surface 70f2 of the preliminary green compact 60e with a column shape and the joint projected surface 70h of the preliminary green compact 60g with a plate shape shown in FIG. 8 are joined, and the joint interface 7b2 shown in FIG. 7 is formed intermittently.

Fourth Embodiment

Hereinafter, Fourth Embodiment is described using FIG. 10 to FIG. 12, but common matters with First to Third Embodiments are not described.

Figure 10:
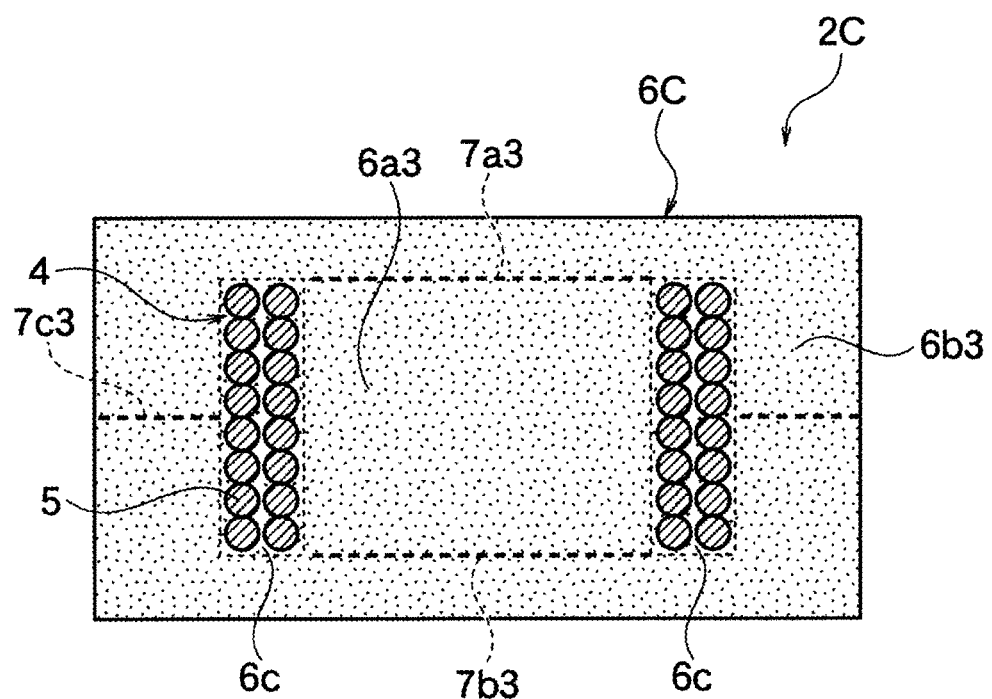
FIG. 10 is a cross-sectional view showing an inductor element manufactured by a method of manufacturing an inductor element according to another embodiment of the present invention.

In an inductor element 2C obtained by a method of manufacturing an inductor element of Fourth Element, as shown in FIG. 10, joint interfaces 7a3 and 7b3 are formed intermittently between an inner core portion 6a3 and an outer circumferential portion 6b3, and a joint interface 7c3 is also formed intermittently inside an intermediate part of the outer circumferential portion 6b3 in the Z-axis direction.

Figure 11:
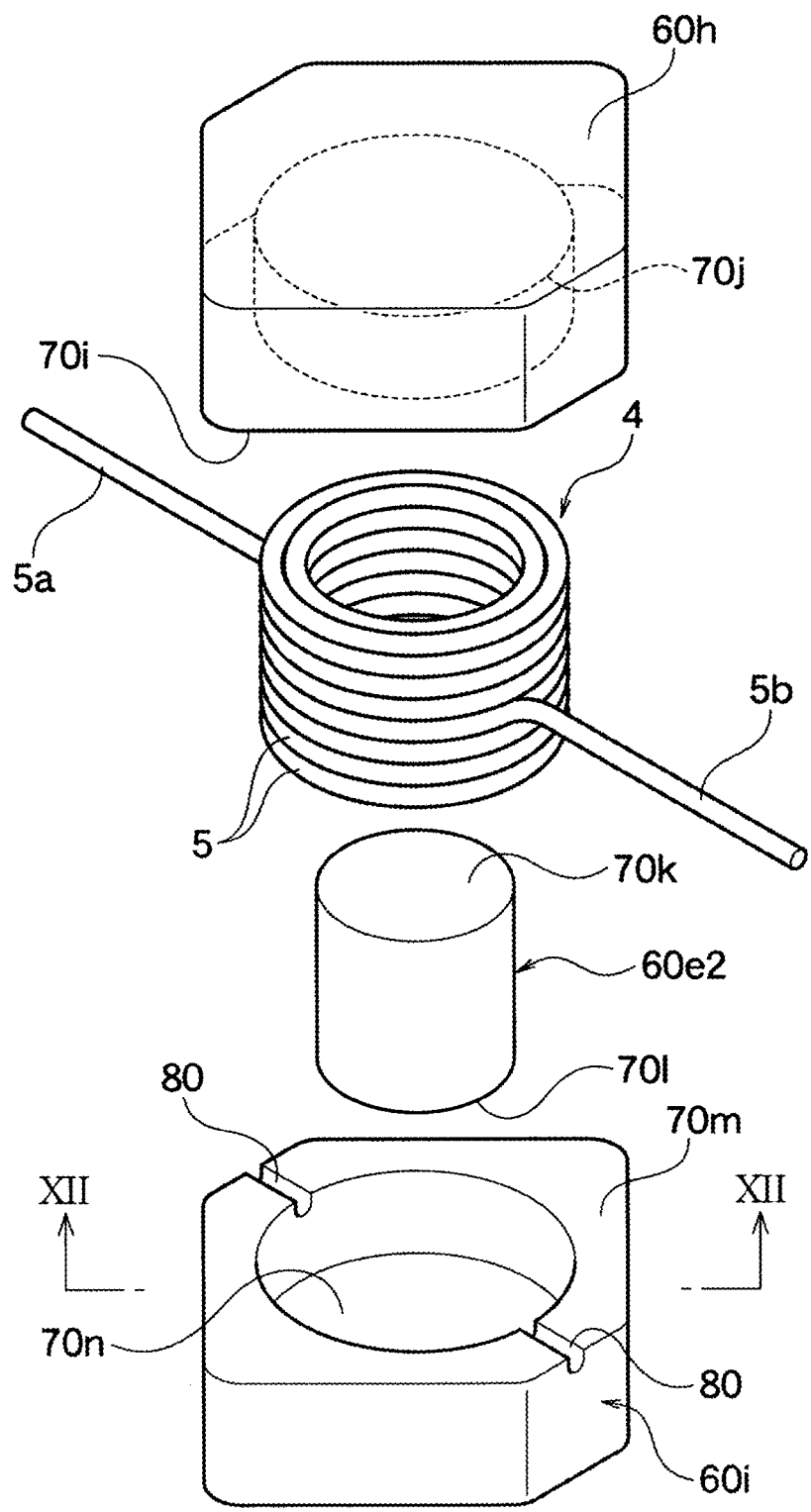
FIG. 11 is a perspective view showing preliminary green compacts and an insert member used in a manufacturing process of the inductor element shown in FIG. 10.

As shown in FIG. 11 and FIG. 12, examples of methods of manufacturing the inductor element 2C of Fourth Embodiment include a method of preparing three preliminary green compacts 60e2, 60h, and 60i. A joint projected surface 70i and a joint projected surface 70m are joined, and the joint interface 7c3 is formed intermittently. A joint projected surface 70j and a joint projected surface 70k are joined, and the joint interface 7a3 is formed intermittently. A joint projected surface 70l and a joint projected surface 70n are joined, and the joint interface 7b3 is formed intermittently.

Incidentally, the present invention is not limited to the above-mentioned embodiments and may be changed variously within the scope of the present invention.

EXAMPLES

Hereinafter, the present invention is described based on more detailed Examples, but is not limited thereto.

Example 1

In Example 1, preliminary green compacts with the shapes in FIG. 2 and FIG. 3 were manufactured by preliminary compression and were then subjected to a main compression, and an inductor element with the shape in FIG. 1 was obtained.

First, granules to be filled in a die cavity were prepared. Fe—Si—Cr alloy (average particle size: 25 µm) was prepared as a magnetic powder, and an insulating film of $SiO_2$ by sol-gel method was formed on the surface of the magnetic powder. The magnetic powder was added with 3 wt % of an epoxy resin diluted into acetone with respect to 100 wt % of the entire magnetic powder and was stirred. After the stirring, the stirred material was passed through a mesh whose size was 250 µm and dried at room temperature for 24 hours, and the granules to be filled in a die cavity were obtained.

The granules were filled in a die cavity and subjected to a preliminary compression, and the preliminary green compacts with the shapes in FIG. 2 and FIG. 3 were manufactured. The pressure during the preliminary compression was shown in Table 1 below.

Next, the manufactured preliminary green compacts and an insert member were arranged in another die cavity that is different from the die used in the preliminary compression. The two preliminary green compacts in FIG. 2 and FIG. 3 and an insert member having a winding portion whose inner diameter was 4 mm and height was 3 mm were arranged inside the cavity in such a manner of FIG. 2 and FIG. 3.

Next, the main compression was carried out by pressurization from top and bottom in the Z-axis direction in FIG. 3. The main compression was carried out at the pressure shown in Table 1.

Thereafter, the green compacts were taken out from the die and heated for 1 hour at 180° C., which was higher than the temperature (110° C.) where the epoxy resin begins to be hardened, and the epoxy resin was hardened, whereby samples (sample numbers 1 to 3) of inductor elements of each example shown in Table 1 were obtained. The size of the obtained core portion was length 7 mm×width 7 mm×height 5.4 mm.

The samples of the inductor elements thus obtained were measured with respect to inductance, DC superposition characteristics, withstand voltage, and tensile strength. In addition, whether an intermittent joint interface exists was confirmed. Table 1 shows the results.

In the measurement of inductance, frequency was 100 KHz, voltage was 0.5 mV, and a LCR meter (made by Hewlett-Packard Co.) was used. An inductance of 55.6 pH or more was determined as being good.

In the measurement of DC superposition characteristics, DC current was applied from zero to the samples of each inductor element, and Idc1 was evaluated, where Idc1 was determined as a current value (ampere) that flows when inductance (µH) was decreased to 80% of inductance at zero current. An Idc1 of 5.8 A or more was determined as being good.

In the measurement of withstand voltage, voltage was applied between a side surface and a side surface facing it of each inductor element using a DC POWER SUPPLY and a LCR meter made by KEYSIGHT, and a voltage when a current of 0.5 mA flowed was determined as a withstand voltage. A withstand voltage of 0.7 kV or more was determined as being good.

In the measurement of tensile strength, a measuring machine of tensile strength (Autograph AGS-5KNX manufactured by Shimadzu Corporation) was used, and the tensile speed was 1 mm/minute. A tensile strength of 2.5 kN or more was determined as being good.

Whether an intermittent joint interface exists was confirmed using a scanning electron microscope (SEM) (made by KEYENCE).

Comparative Example 1

In Comparative Example 1, preliminary green compacts were manufactured and a main compression was carried out in a similar manner to Example 1 except for the pressures during a preliminary compression and a main compression, and samples (sample numbers 11 to 13) of inductor elements of each comparative example shown in Table 1 were obtained. Table 1 shows the results.

TABLE 1

| | Sample No. | pressure during preliminary compression molding (MPa) | pressure during main compression (MPa) | withstand voltage (kV) | inductance L (µH) | DC superposition characteristic Idc1 (A) | tensile strength (kN) | existence of intermittent joint interface |
|---|---|---|---|---|---|---|---|---|
| Example 1 | 1 | 400 | 400 | 0.7 | 57.0 | 5.8 | 2.5 | present |
| | 2 | 600 | 400 | 0.8 | 57.0 | 5.9 | 2.7 | present |
| | 3 | 800 | 400 | 1.0 | 57.0 | 6.0 | 2.8 | present |
| Comparative Example 1 | 11* | 100 | 400 | 0.7 | 47.0 | 4.1 | 1.9 | absent |
| | 12* | 100 | 600 | 0.6 | 48.0 | 3.9 | 2.1 | absent |

TABLE 1-continued

| Sample No. | | pressure during preliminary compression molding (MPa) | pressure during main compression (MPa) | withstand voltage (kV) | inductance L (μH) | DC superposition characteristic Idc1 (A) | tensile strength (kN) | existence of intermittent joint interface |
|---|---|---|---|---|---|---|---|---|
| | 13* | 100 | 800 | 0.4 | 49.0 | 3.7 | 2.2 | absent |
| Example 2 | 31 | 400 | 400 | 0.8 | 55.6 | 6.7 | 2.5 | present |
| Comparative Example 2 | 51* | no preliminary compression | 400 | 0.6 | 47.0 | 4.2 | 1.6 | absent |
| Comparative Example 3 | 61* | 400 | 800 | 0.4 | 57.4 | 4.9 | 3.0 | absent |
| Comparative Example 4 | 71* | 1200 | 800 | 0.2 | 52.0 | 6.0 | 1.0 | continuous joint interface |

*comparative example

Table 1 shows that sample numbers 1 to 3 corresponding to Example 1 of the present application were more excellent than sample numbers 11 to 13 corresponding to Comparative Example 1 of the present application with respect to inductance, DC superposition characteristics, or tensile strength. In Example 1, the larger a pressure during the preliminary compression was, the better a withstand voltage was. In Comparative Example 1, however, the larger a pressure during the main compression was, the lower a withstand voltage was. In sample numbers 1 to 3, an intermittent joint interface was formed. On the other hand, no joint interface was formed, or a continuous joint interface was formed in Comparative Example 1.

In Comparative Example 1, the larger a pressure during the main compression was, the more easily a coil film was peeled, and a short circuit was easily generated by abrasion between the die for compression and the magnetic powder, whereby withstand voltage was decreased. On the other hand, in Example 1, the preliminary green compacts formed densely in advance were subjected to the main compression at a relatively low pressure, and the coil was thereby less damaged during the main compression. Thus, in Example 1, withstand voltage was not small even if a pressure during the main compression was large.

Example 2

An inductor element of sample number 31 was manufactured in a similar manner to sample number 1 except that five preliminary green compacts with the shapes in FIG. 8 and FIG. 9 were manufactured, and a main compression was carried out in the manner shown in FIG. 7.

Comparative Example 2

After granules were manufactured in a similar manner to sample number 1 of Example 1, an insert member was arranged in a die cavity for main compression, and the granules were filled therein, whereby a main compression was carried out without preliminary compression. An inductor element of sample number 51 was manufactured in a similar to sample number 1 of Example 1 except that the main compression was carried out without preliminary compression.

Comparative Example 3

In Comparative Example 3, preliminary green compacts were manufactured and a main compression was carried out, in a similar manner to sample number 1 of Example 1 except for the pressure during the main compression, whereby a sample (sample number 61) of an inductor element of each comparative example shown in Table. 1 was obtained. Table 1 shows the results.

Comparative Example 4

In Comparative Example 4, preliminary green compacts were manufactured and a main compression was carried out, in a similar manner to sample number 1 of Example 1 except for the pressures during a preliminary compression and a main compression, whereby a sample (sample number 71) of an inductor element of each comparative example shown in Table. 1 was obtained. Table 1 shows the results.

Figure 13:
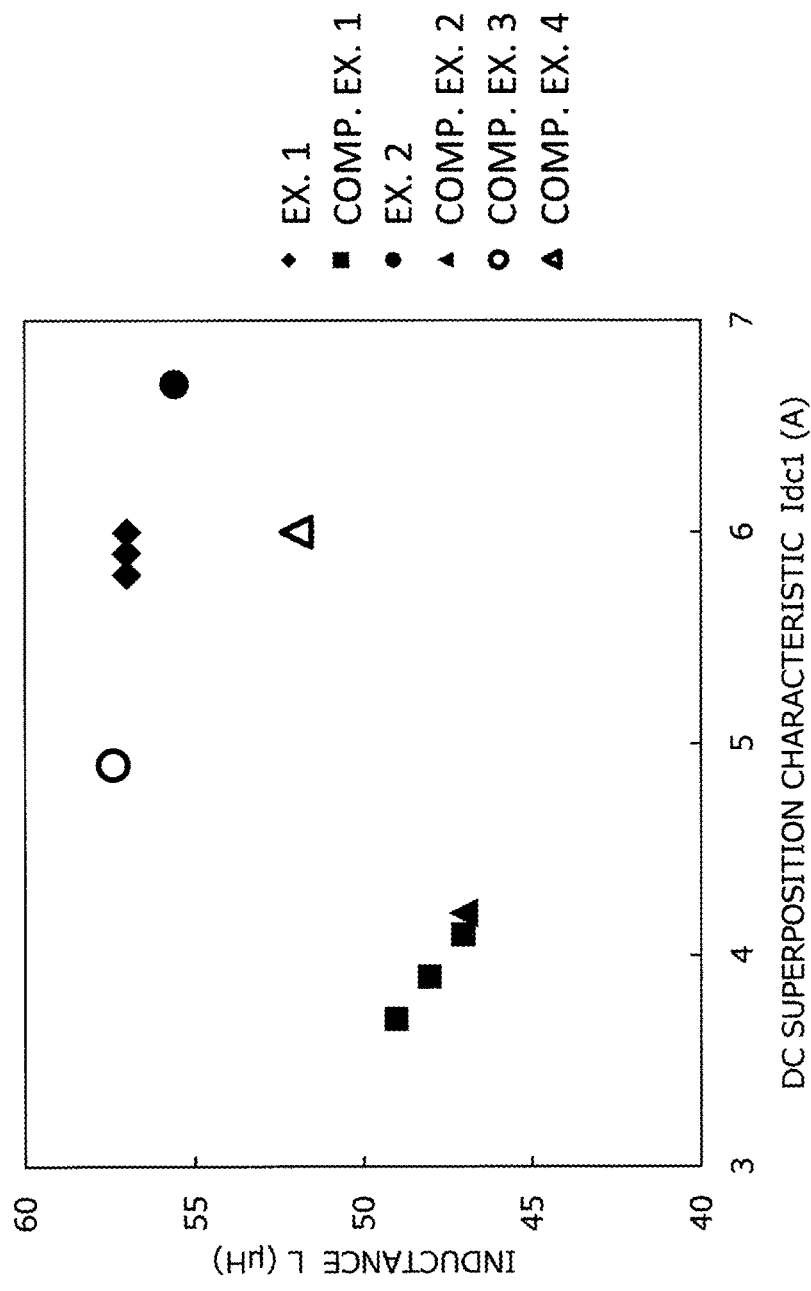
FIG. 13 is a graph showing characteristics of Example and Comparative Example of the present invention.

Sample numbers 1 to 3, 11 to 13, 31, 51, 61, and 71 of the above-mentioned examples and comparative examples were measured with respect to inductance and DC superposition characteristics, and their results are shown in FIG. 13.

It is understood from FIG. 13 that the inductor elements of sample numbers 1 to 3 and 31, which were examples of the present application, were more excellent in inductance and/or DC superposition characteristics than the inductor elements of sample numbers 11 to 13, 51, 61, and 71, which were comparative examples of the present application. Moreover, sample number 31, which had large numbers of preliminary green compacts and joint interfaces, was more excellent in DC superposition characteristics than those of sample number 1, which had small numbers of preliminary green compacts and joint interfaces. In addition, the inductor element of sample number 11 of Comparative Example 1 was equal to sample number 51 of Comparative Example 2, which was obtained by a method of conducting only the main compression without forming a preliminary green compact, with respect to inductance and DC superposition characteristics.

For example, in sample numbers 11 to 13 of Comparative Example 1, the pressures during the preliminary compression were too low, and DC superposition characteristics and tensile strength were consequently lower than those of Example 1 and Example 2 (sample numbers 1 to 3 and 31). In sample number 61 of Comparative Example 3, the pressure during the preliminary compression was lower than the pressure during the main compression, and withstand voltage and DC superposition characteristics were consequently lower than those of Example 1 and Example 2. In addition, sample number 61 of Comparative Example 3 had no intermittent joint interface. In sample 71 of Comparative Example 4, the pressure during the preliminary compression was too high, and withstand voltage, inductance, and tensile strength were consequently inferior to those of Example 1 and Example 2. In addition, a continuous joint interface was formed in sample number 71 of Comparative Example 4.

NUMERICAL REFERENCES 2, 2A, 2B, 2C . . . inductor element
4 . . . winding portion
5 . . . conductor
5a, 5b . . . lead portion
6, 6A, 6B, 6C . . . core portion
6a, 6a1, 6a2, 6a3 . . . inner circumferential portion
6b, 6b1, 6b2, 6b3 . . . outer circumferential portion
6c . . . space between conductors
6d . . . intermediate position
7, 7a1, 7a2, 7a3, 7b1, 7b2, 7b3, 7c, 7c3 . . . joint interface
60a to 60k . . . preliminary green compact
70a to 70n . . . joint projected surface
80 . . . leading groove
90a, 90b . . . housing concave portion

The invention claimed is:
1. An inductor element, comprising:
a winding portion where a conductor is wound in a coil shape; and
a core portion surrounding the winding portion and containing a magnetic powder and a resin,
wherein three or more abutting pairs of magnetic particles in the core portion, in which the magnetic particles of each of the pairs of magnetic particles are adjacent but not in contact, form, intermittently in the core portion, a joint interface that can be observed linearly on a cross section of the inductor element by a low-accelerating voltage scanning electron microscope.

* * * * *